United States Patent
Herchen (10) Patent No.: US 7,831,135 B2
(45) Date of Patent: Nov. 9, 2010

(54) METHOD AND SYSTEM FOR CONTROLLING BAKE PLATE TEMPERATURE IN A SEMICONDUCTOR PROCESSING CHAMBER

(75) Inventor: Harald Herchen, Los Altos, CA (US)

(73) Assignee: Sokudo Co., Ltd., Kyoto (JP)

( * ) Notice: Subject to any disclaimer, the term of this patent is extended or adjusted under 35 U.S.C. 154(b) by 355 days.

(21) Appl. No.: 11/849,978

(22) Filed: Sep. 4, 2007

(65) Prior Publication Data

US 2009/0060480 A1    Mar. 5, 2009

(51) Int. Cl.
*A21B 2/00* (2006.01)
*A21B 1/00* (2006.01)
*C23C 16/00* (2006.01)

(52) U.S. Cl. ................. 392/416; 219/405; 118/725

(58) Field of Classification Search ........... 392/416, 392/407–443; 219/405; 118/724, 725, 726; 432/9
See application file for complete search history.

(56) References Cited

U.S. PATENT DOCUMENTS

| 6,323,463 | B1 * | 11/2001 | Davis et al. ......... 219/390 |
| 6,767,752 | B2 * | 7/2004 | Nakano et al. ......... 438/7 |
| 2002/0008099 | A1 * | 1/2002 | Davis et al. ......... 219/390 |
| 2006/0130750 | A1 | 6/2006 | Ishikawa et al. |
| 2009/0183677 | A1 * | 7/2009 | Tian et al. ......... 118/667 |

* cited by examiner

*Primary Examiner*—Daniel Robinson
(74) *Attorney, Agent, or Firm*—Townsend and Townsend and Crew LLP (57) ABSTRACT

A method of operating a bake plate disposed in a semiconductor processing chamber having a face plate opposing the bake plate includes providing a temperature control signal to the bake plate and measuring a face plate temperature associated with the face plate. The method also includes determining a difference between the face plate temperature and a predetermined temperature and modifying the temperature control signal provided to the bake plate in response to the determined difference.

5 Claims, 6 Drawing Sheets

FIG. 6

METHOD AND SYSTEM FOR CONTROLLING BAKE PLATE TEMPERATURE IN A SEMICONDUCTOR PROCESSING CHAMBER

BACKGROUND OF THE INVENTION

The present invention relates generally to the field of substrate processing equipment. More particularly, the present invention relates to methods and system for providing temperature control of a semiconductor substrate disposed between a bake plate and an opposing face plate.

Modern integrated circuits contain millions of individual elements that are formed by patterning the materials, such as silicon, metal and/or dielectric layers, that make up the integrated circuit to sizes that are small fractions of a micrometer. The technique used throughout the industry for forming such patterns is photolithography. A typical photolithography process sequence generally includes depositing one or more uniform photoresist (resist) layers on the surface of a substrate, drying and curing the deposited layers, patterning the substrate by exposing the photoresist layer to electromagnetic radiation that is suitable for modifying the exposed layer and then developing the patterned photoresist layer.

It is common in the semiconductor industry for many of the steps associated with the photolithography process to be performed in a multi-chamber processing system (e.g., a cluster tool) that has the capability to sequentially process semiconductor wafers in a controlled manner. One example of a cluster tool that is used to deposit (i.e., coat) and develop a photoresist material is commonly referred to as a track lithography tool.

Track lithography tools typically include a mainframe that houses multiple chambers (which are sometimes referred to herein as stations) dedicated to performing the various tasks associated with pre- and post-lithography processing. A typically dry processing chamber within a track lithography tool include a thermal control unit that house a bake and/or chill plate on which a wafer substrate can be loaded opposing a face plate. The loaded wafer substrate usually is supported on a plurality of proximity pins forming a thermal conductive air gap with a predetermined separation. Track lithography tools also frequently include one or more pod/cassette mounting devices, such as an industry standard FOUP (front opening unified pod), to receive wafer substrates from and return wafer substrates to the clean room, multiple transfer robots to transfer wafer substrates between the various chambers/stations of the track tool and an interface that allows the tool to be operatively coupled to a lithography exposure tool in order to transfer wafer substrates into the exposure tool and receive wafer substrates from the exposure tool after the wafer substrates are processed within the exposure tool.

Over the years there has been a strong push within the semiconductor industry to shrink the size of semiconductor devices. The reduced feature sizes have caused the industry's tolerance to process variability to shrink, which in turn, has resulted in semiconductor manufacturing specifications having more stringent requirements for process uniformity and repeatability. An important factor in minimizing process variability during track lithography processing sequences is to ensure that every wafer substrate processed within the track lithography tool for a particular application has the same "wafer history." A substrate's wafer history is generally monitored and controlled by process engineers to ensure that all of the device fabrication processing variables that may later affect a device's performance are controlled, so that all substrates in the same batch are always processed the same way.

To ensure that each substrate has the same "wafer history" requires that each wafer substrate experiences the same repeatable substrate processing steps (e.g., consistent coating process, consistent hard bake process, consistent chill process, and the like) and the timing between the various processing steps is the same for each substrate. Lithography type device fabrication processes can be especially sensitive to variations in process recipe variables and the timing between the recipe steps, which directly affects process variability and ultimately device performance. Thus, there is a need in the art for improved methods and systems for providing improved bake processes for semiconductor substrates on a bake plate opposing a face plate.

SUMMARY OF THE INVENTION

According to the present invention, methods and system related to substrate processing are provided. More particularly, the present invention relates to methods and system for providing temperature control of a semiconductor substrate or wafer disposed between a bake plate and an opposing face plate. Merely by way of example, embodiments of the present invention have been applied to maintain constant wafer temperature during a track lithography process by adjusting bake plate temperature to compensate for changes in face plate temperature. While embodiments of the invention may prove to be particularly useful in a bake station of a track lithography tool, other embodiments of the invention can be used in other applications where it is desirable to heat substrates in a highly controllable manner.

According to a specific embodiment, the present invention provide a method of operating a bake plate disposed in a semiconductor processing chamber including a face plate opposing the bake plate. The method comprises providing a temperature control signal to the bake plate and measuring a face plate temperature associated with the face plate. Additionally, the method includes determining a difference between the face plate temperature and a predetermined temperature. Moreover, the method includes modifying the temperature control signal provided to the bake plate in response to the determined difference. In one embodiment, the method further includes adjusting a heating element associated with the bake plate to change a bake plate temperature from a first temperature to a second temperature based on the modified temperature control signal. Furthermore, the method includes waiting a predetermined time, measuring a second face plate temperature associated with the face plate, determining a second difference between the second face plate temperature and the predetermined temperature, and modifying the temperature control signal provided to the bake plate in response to the second determined difference.

In another embodiment, the present invention provide a method of controlling temperature of a wafer in a semiconductor process chamber. The method includes loading a wafer on a bake plate. The wafer opposes a face plate. The bake plate includes a plurality of heater zones. The method further includes providing a plurality of temperature control signals to the bake plate. Each of the plurality of temperature control signals is directed to one of the plurality of heater zones. Additionally, the method includes performing temperature measurements at a plurality of regions on the face plate. Each of the plurality of regions correspondingly opposes one of the plurality of heater zones. Moreover, the method includes determining a difference between a face plate temperature at each of the plurality of regions and a predetermined temperature and modifying each of the plurality of temperature control signals provided to the bake plate in response to the determined difference.

In an alternative embodiment, the present invention provides a bake chamber configured to perform a thermal treatment process on a substrate. The bake chamber includes a bake plate configured to receive one or more thermal control signals and a face plate opposing the bake plate. Additionally, the bake chamber includes one or more temperature sensors in thermal communication with the face plate and configured to output one or more measurement signals. Moreover, the bake chamber includes control circuitry configured to receive the one or more measurement signals from the one or more temperature sensors. The control circuitry further are configured to compute one or more temperature differences between the one or more measurement signals and one or more predetermined temperatures and modify the one or more thermal control signals based on the computed temperature differences.

Many benefits are achieved by way of the present invention over conventional techniques. For example, embodiments of present invention replace conventional methods of performing temperature measurement using optical pyrometers, which may be insufficiently repeatable for some wafer processing operations. Embodiments of the invention also provide a method to reduce or eliminate direct wafer contact possible when using thermocouples to measure wafer temperature, which may result in generation of particles. In addition, certain embodiments of the present invention implement a steady state temperature control for the wafer between a bake plate and a face plate by taking the actual face plate temperature drift into account and using bake plate temperature adjustment to achieve appropriate compensation. Various benefits and advantages that can be achieved by use of the present invention will be described in detail throughout the present specification and more particularly below in conjunction with the following drawings.

DETAILED DESCRIPTION OF SPECIFIC EMBODIMENTS

According to the present invention, methods and system related to substrate processing are provided. More particularly, embodiments of the present invention pertain to a method and system for providing temperature control of a substrate disposed between a bake plate and an opposing face plate in a thermal module of a track lithography tool. Although certain embodiments of the present invention have been applied to maintain a substantially constant wafer temperature in a bake chamber of a track lithography tool by adjusting the bake plate temperature to compensate for changes in the face plate temperature, other embodiments of the present invention are not limited by this particular application.

Figure 1:
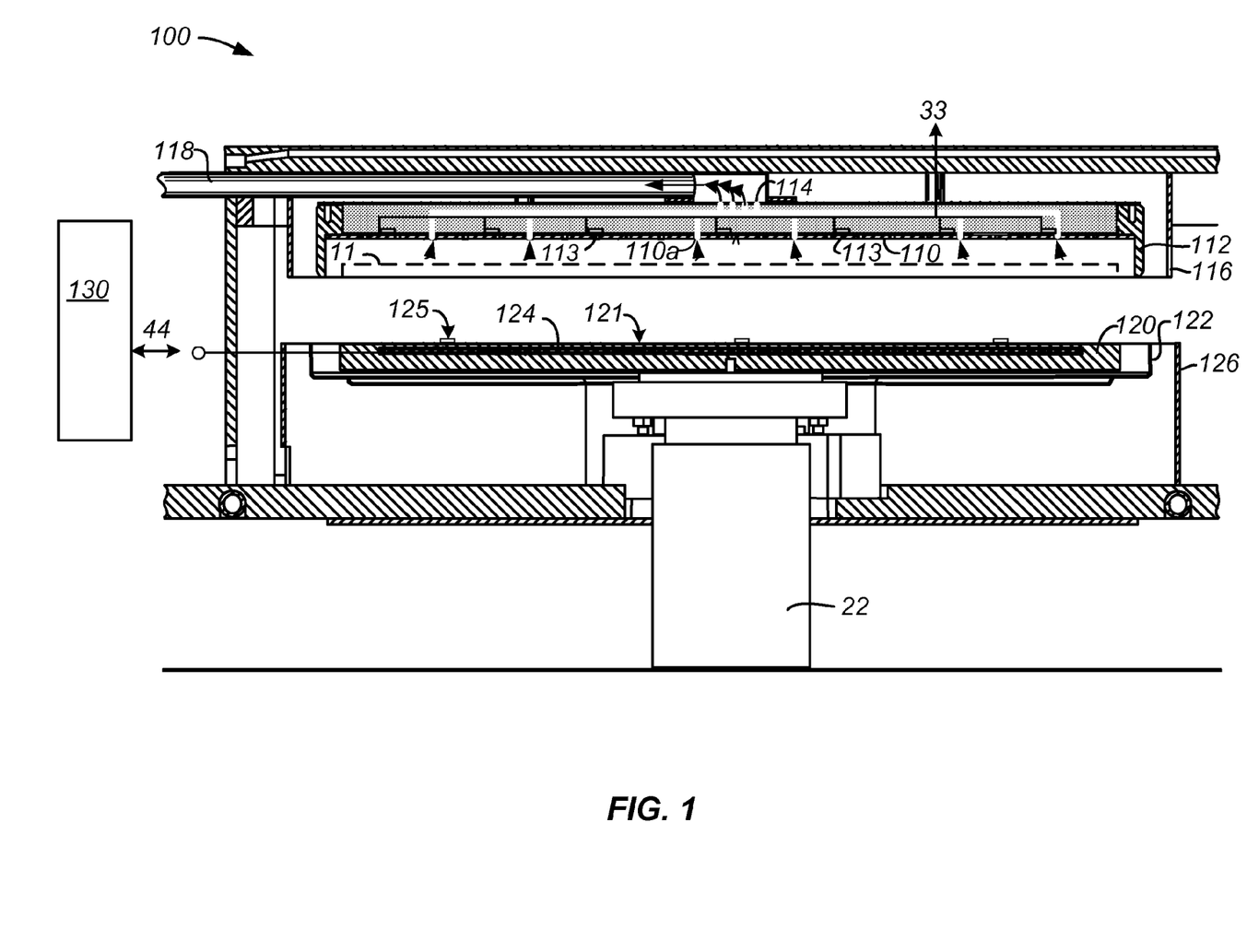
FIG. 1 is a simplified cross sectional view of a bake chamber according to an embodiment of the invention.

FIG. 1 is a simplified cross sectional view of a bake chamber according to an embodiment of the invention. This diagram is merely an example, which should not unduly limit the scope of the claims herein. One of ordinary skill in the art would recognize other variations, modifications, and alternatives. As shown in FIG. 1, bake chamber 100 has at least two separate isothermal elements: a face plate 110 and a bake plate 120, each of which is manufactured from a material exhibiting high heat conductivity, such as aluminum or other appropriate material. Each plate 110 or 120 has one or more heating elements, for example, resistive heating elements, embedded within the plate or otherwise in thermal communication with the plate. Bake chamber 100 also includes a top side plate 112 and a bottom cup 122, each coupled to the face plate 110 and bake plate 120, respectively. In addition, bake chamber 100 further includes top and bottom heat shields 116 and 126, respectively. In the embodiment illustrated in FIG. 1, each of the heat shields 116 or 126 are made from aluminum.

In one embodiment, the upper surface 121 of bake plate 120 includes a plurality of proximity pins 125 configured to support a wafer loaded onto the proximity pins. Each proximity pins 125 has a calibrated height above the upper surface 121 so that a substantially flat bottom surface of a loaded wafer is supported on the proximity pins with a predetermined distance between the bottom surface of the wafer and the upper surface 121 of the bake plate 120. Also, in one embodiment, bake plate 120 includes a plurality of vacuum ports (not shown in FIG. 1), which are operatively coupled to the bake plate to form a vacuum chuck configured to secure the wafer to the bake plate 120.

In a specific embodiment, bake plate 120 is operatively coupled to a motorized lift 22 so that the bake plate 120 can be raised from a wafer loading/receiving position to a baking position. Typically, the wafers or substrates are heated on bake plate 120 after the bake plate is raised to the baking position 11 (shown as a dashed line in FIG. 1) within a clam shell enclosure that contains the face plate 110 surrounded by the top side plate 112. When the bake plate is positioned in the baking position, the bottom cup 122 encircles a bottom portion of top side plate 112 forming the clam shell arrangement, which helps confine heat generated by bake plate 120 within an inner cavity formed by the bake plate and the enclosure. At the same time, the face plate 110 is positioned just above and opposing a top surface of the wafer supported on bake plate 120.

In another specific embodiment, face plate 110 includes a plurality of holes or channels 110a that allow gases and contaminants baked off the wafer surface during baking processes to drift through face plate 110 and into a radially inward gas passageway that is provided as an inner structure (not shown) of the face plate 110. Gas that flows in a radially inward direction through the gas passageway is initially introduced into bake chamber 100 by a gas inlet line (not shown) at an annular gas manifold (not shown) that encircles the outer portion of top part of the face plate assembly. The gas manifold includes numerous small gas inlets that allow gas to flow from the manifold into the inner structure (not shown) of the face plate 110. The gas flows radially inward towards the center of the bake station through a diffusion plate 114 that includes a plurality of gas outlet holes. After flowing through diffusion plate 114, gas exits bake chamber 100 through gas outlet line 118. As will be evident to one of skill in the art, the inward and outward radial flows may be reversed as appropriate to the particular application.

Based on the bake chamber system configuration described above, the bake plate temperature can be accurately controlled via the embedded heating element provided in the bake plate in combination with control of the bake plate to wafer gap via the calibrated height of the proximity pins. Other conditions effecting the wafer temperature, including the face plate temperature and emissivity, gas thermal conductivity (once the flow rate and pressure are controlled), and the wafer to the face plate gap can be controlled in a repeatable manner during operation. Therefore in the bake chamber system configuration provided in accordance with embodiments of the present invention, the temperature of the wafer on the bake plate can, in principle, reach a steady state that is fully controllable once the appropriate conditions are known and repeatable. In practice, certain conditions tend to drift or change over time. For example, the face plate temperature is typically ignored in computations related to determining the bake plate temperature used to achieve the desired wafer temperature under the steady state condition. Such computations may lead to offsets in setting the bake plate temperature and errors in providing the desired wafer temperature.

Figure 2:
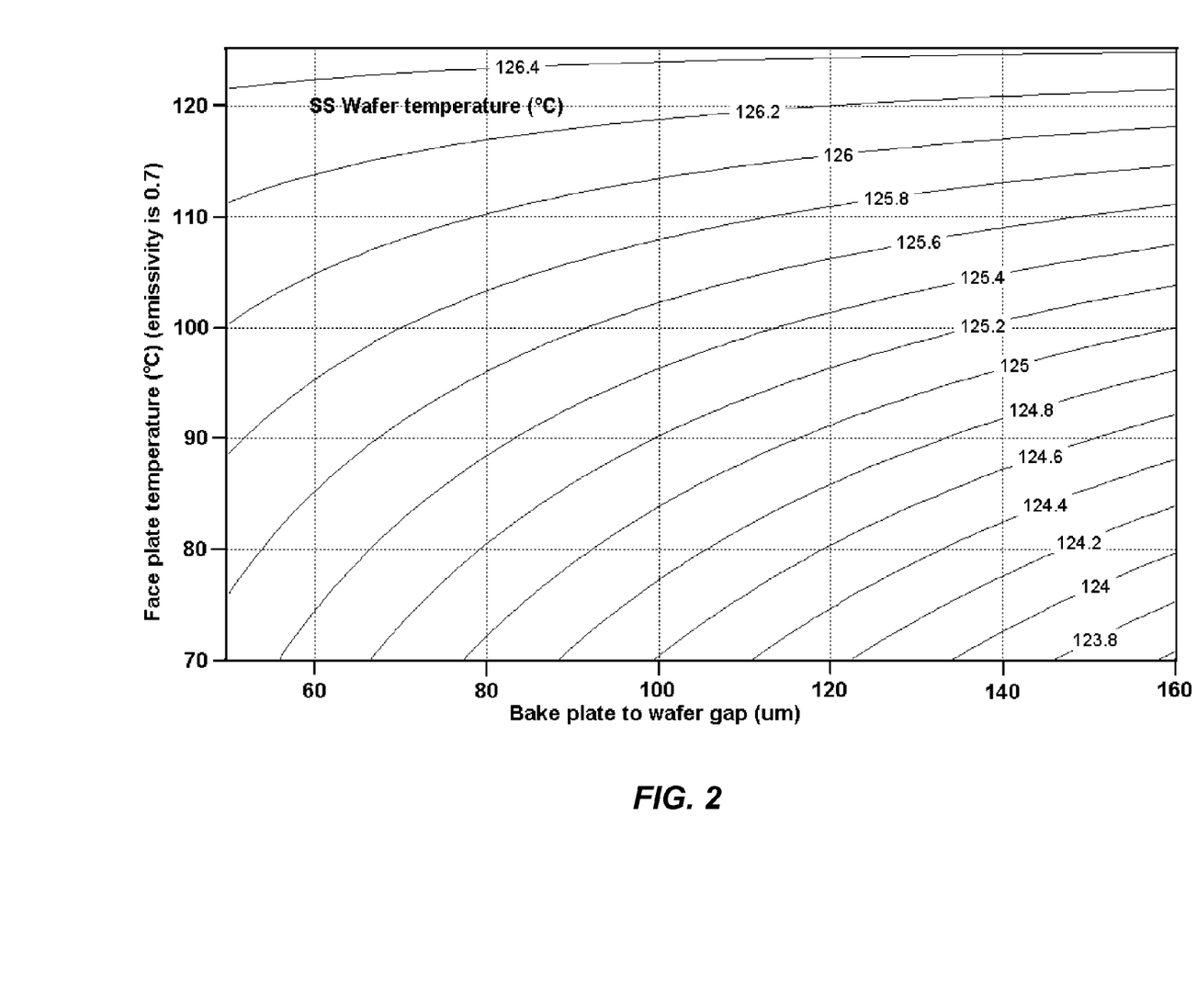
FIG. 2 is a simulation contour plot of wafer temperature sensitivity to face plate temperature and wafer-to-bake plate gap according to an embodiment of the present invention.

FIG. 2 is a simulation contour plot of wafer temperature sensitivity to face plate temperature and wafer-to-bake plate gap according to an embodiment of the present invention. This diagram is merely an example, which should not unduly limit the scope of the claims herein. One of ordinary skill in the art would recognize other variations, modifications, and alternatives. For example, the simulation results in FIG. 2 is based on the bake chamber 100 and associated system configuration shown in FIG. 1. As shown, for a given bake plate to wafer gap, changes in the face plate temperature will affect the steady state wafer temperature. For example, assuming a 100 µm gap distance between the bake plate (which is at a set point temperature) and the wafer, if the face plate temperature drifts from about 85° C. to about 92° C., the wafer temperature under the steady state condition would change from 125° C. to 125.2° C. Thus, if no adjustments or compensation is made for this temperature change in the face plate, the error in estimating the wafer temperature would be 0.2° C. off the true temperature value. Embodiments of the present invention provide for temperature compensation methods and systems useful in correcting this exemplary 0.2° C. error, thereby maintaining the wafer temperature at the desired steady state temperature.

Embodiments of the present invention provide a method of providing substantially steady state wafer temperature control by accurately monitoring the face plate temperature and then determining and adjusting the bake plate temperature based on the measured plate temperature. Thus, face plate temperature drift is correctly compensated for during thermal processes by embodiments of the present invention. Further details of the method and related system setup will be described throughout this specification and more particularly below.

In one embodiment, the bake plate temperature can be controlled by receiving a temperature control signal from a controller 130. As shown in FIG. 1, controller 130 can deliver the temperature control signal through a port 44 to the bake plate 120. The temperature control signal is directed to the one or more heating elements 124 embedded within the bake plate 120. The one or more heating elements 124 are then able to adjust the power settings to increase or decrease the bake plate temperature so that the bake plate temperature becomes equal to a set point temperature, which may be predetermined prior to baking the wafer. As an example, for a wafer loaded on the bake plate 120 and in baking position 11, a desired steady state temperature may be provided in advance of baking processes and may be modified during baking as appropriate to the particular application. In another embodiment, there are a plurality of temperature sensors 113 associated with the face plate 110. Each sensor 113 contains a thermal measurement device such as a thermocouple or a resistance temperature detector (RTD). Sensor 113 is configured to sense a temperature at a local region of the face plate 110 and to collect temperature data either periodically or aperiodically.

As illustrated in FIG. 1, the controller 130 is configured to receive sensor data from the plurality of sensors 113. Referring to FIG. 1, the sensor data measured at the sensors 113 is transmitted from another port 33 coupled to the plurality of temperature sensors 113 to the controller 130. In alternative embodiments, wired connections are provided to transmit the data from the port 33 to the controller. Each sensor data value represent a measured temperature of a corresponding region on the face plate. The controller 130 is capable of processing the received sensor data, for example, making comparisons with one or more predetermined temperature values stored therein, determining a difference between the measured face plate temperature and the predetermined temperature value, and modifying the temperature control signal (provided to the bake plate) based on the determined temperature difference.

Assuming the response time of the plurality of sensors 113 is $t_c$, the controller 130 is able to refresh the temperature control signal every time period of $t_c$. The modified temperature control signal can then be delivered to the bake plate 120 through the port 44 at a similar period, that is, the time period of $t_c$. Based on the modified temperature control signal, the bake plate temperature can be adjusted from a first temperature at a first time to a second temperature at a second time, the first and second times being separated by the period $t_c$. Thus, embodiments of the present invention provide for temperature compensation for the face plate temperature drift during bake processes. Generally, the system operates on a periodic basis (e.g., time period of $t_c$), although this is not required by the present invention. Depending on the temperature differences measured by the system, the period may be adjusted to longer or shorter times as appropriate to the particular application. In one embodiment, the sensor response time is about 50 seconds. In another embodiment, the sensor response time is about 20 seconds. In yet another embodiment, the sensor response time is preferably no greater than 10 seconds. One of ordinary skill in the art would recognize many variations, modifications, and alternatives.

Figure 3:
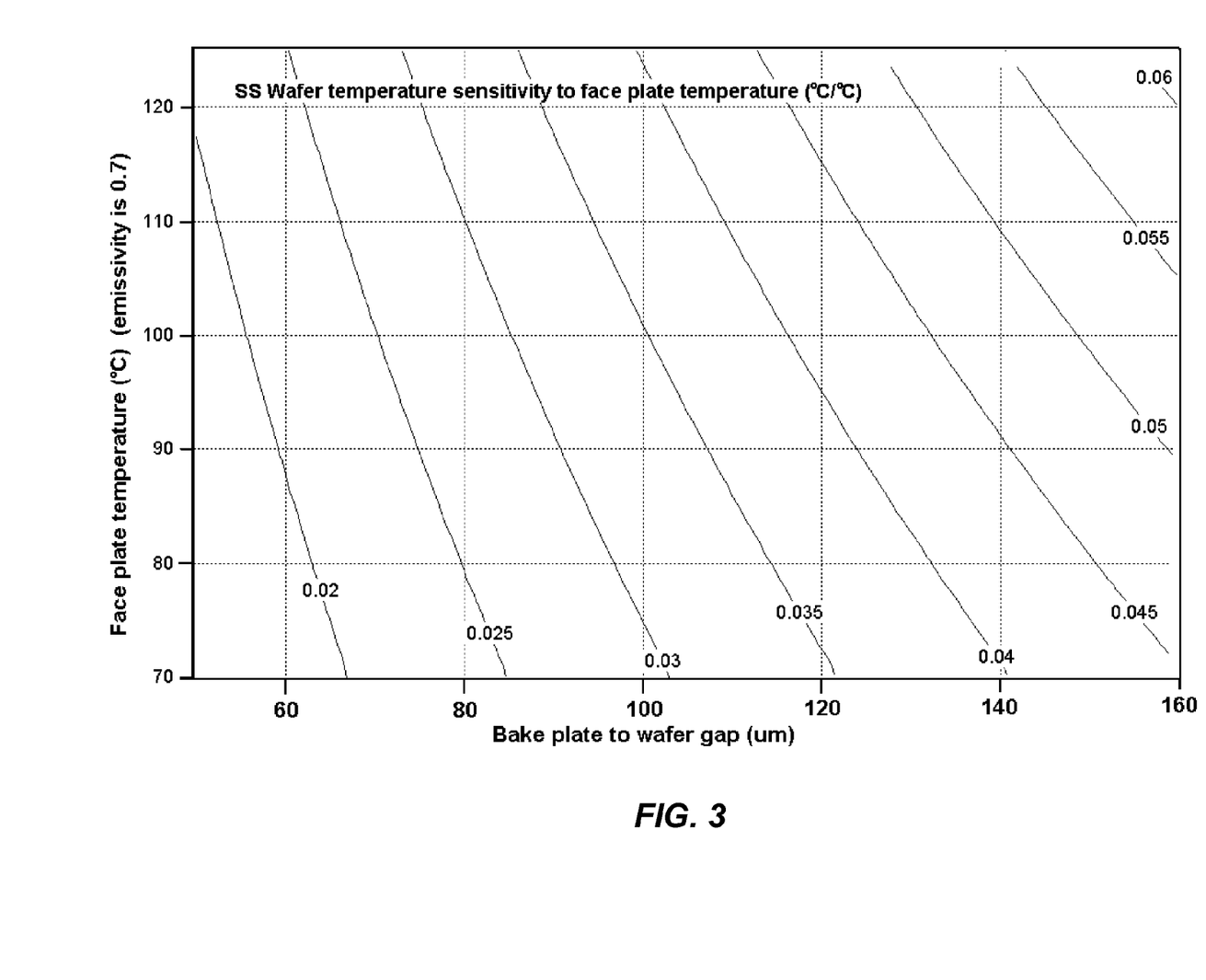
FIG. 3 is an alternative simulation contour plot of wafer temperature sensitivity to face plate temperature and wafer-to-bake plate gap according to another embodiment of the present invention.

FIG. 3 is an alternative simulation contour plot of wafer temperature sensitivity to face plate temperature and wafer-to-bake plate gap according to another embodiment of the present invention. This diagram is merely an example, which should not unduly limit the scope of the claims herein. One of ordinary skill in the art would recognize other variations, modifications, and alternatives. For example, the simulation results in FIG. 3 is based on the bake chamber 100 and associated system configuration shown in FIG. 1. As shown, the wafer temperature sensitivity to face plate temperature is illustrated as wafer temperature change per degree change of the face plate temperature at a fixed bake plate temperature. For example, assuming a 100 µm gap distance between the bake plate (which is set at a first temperature) and the wafer, if the face plate temperature changes from 101° C. to 100° C. (a change of 1° C.), the wafer temperature will increase by 0.035° C. Since the baking process is preferably performed in a steady state with all other conditions set in a repeatable manner, the change of wafer temperature as a result of the face plate temperature change can be corrected via a bake plate temperature compensation based on FIG. 3.

For example, using the numbers given above, if the face plate temperature decreases by 1° C., from 101° C. to 100° C., then the bake plate temperature would need to be increased from the first temperature by 0.035° C. to a second temperature. In other words, the corrected temperature of the bake plate should be equal to the first temperature plus 0.035° C. Of course, there can be many variations, alternatives, and modifications for the expected magnitude of the correction using the bake plate temperature compensation depending on particular bake chamber system configuration and thermal process conditions. The values illustrated in FIG. 3 are merely exemplary values for a particular configuration. In one embodiment, based on a known bake chamber system setup and thermal process conditions, the compensation used can be determined using a pre-programmed algorithm in the controller and executed through one or more temperature control signal directed to the bake plate.

Because the emissivity of the face plate affects the radiation transfer to and from the face plate, the emissivity affects the face plate temperature drift. In order to reduce the face plate temperature drift, embodiments of the present invention maintain the emissivity of the face plate at a substantially constant value. As an example, the simulation results presented in FIG. 2 and FIG. 3 utilize an emissivity value of 0.7 for the face plate. During actual baking process, radicals or organic molecules may be vaporized from the substrate surface. Although most of these vapors are removed from the bake chamber by the central inward gas flow, some may deposit on the face plate surface. These organic depositions tend to increase the emissivity of the face plate. Therefore, if the emissivity of the face plate is initially near a maximum possible value of one, the possible change of the emissivity is reduced and preferably becomes negligible since the emissivity cannot exceed a value of one. Although higher emissivity values result in increased radiation transfer in and out of the face plate, the substrate temperature can become more repeatable, which is desired in steady state temperature control applications. In one embodiment, the face plate 110 is made from aluminum or other suitable materials and is coated with one or more high emissivity materials having an emissivity greater than 0.95 in the infrared frequency range. For example, possible coating materials include PFA, polyimide, photoresist, and the like.

Figure 4:
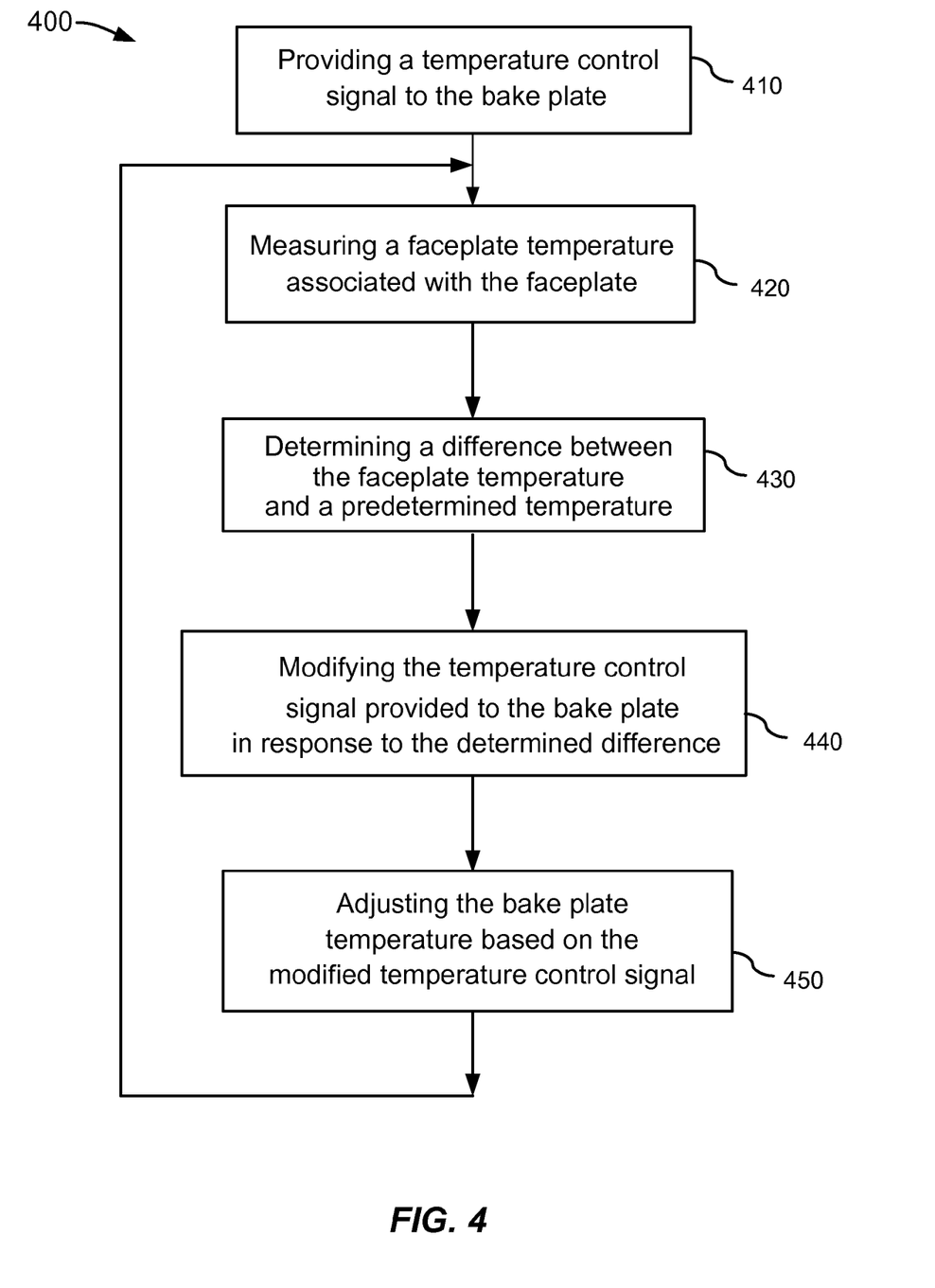
FIG. 4 is a simplified flow chart illustrating a method of performing wafer temperature control according to an embodiment of the present invention.

FIG. 4 is a simplified flow chart illustrating a method of performing wafer temperature control according to an embodiment of the present invention. This diagram is merely an example, which should not unduly limit the scope of the claims herein. One of ordinary skill in the art would recognize other variations, modifications, and alternatives. For example, the method 400 illustrated in FIG. 4 may be performed after a wafer has been loaded on a bake plate, which is then raised to a baking position opposing a face plate in a thermal enclosure of the bake chamber. The method 400 includes providing a temperature control signal to the bake plate (410) and measuring a face plate temperature associated with the face plate (420). Additionally, the method includes determining a difference between the face plate temperature and a predetermined temperature (430). Moreover, the method includes modifying the temperature control signal provided to the bake plate in response to the determined difference (440). Furthermore, the method may include adjusting the bake plate temperature based on the modified temperature control signal to maintain a wafer temperature at a steady state (or a desired process temperature) (450).

For example, in an embodiment, a controller coupled to the bake chamber is configured to provide one or more temperature control signals to the bake plate. In one embodiment, the controller can be disposed outside the bake chamber. Referring to step 410, the controller is able to send one or temperature control signals through a communication port into a receiving unit that is coupled to one or more corresponding heating elements embedded in the bake plate. In response to the one or more temperature control signals, the temperature of the corresponding one or more heating elements is modified, thereby controlling the wafer temperature. In one example, the communication port is coupled to heating elements that are located at multiple separate zones in the bake plate. In another example, the communication port may be able to transmit or receive a wireless signal.

In another embodiment, the controller may include control circuitry built into the bake chamber and configured to receive sensor data from a plurality of temperature sensors disposed on the face plate. At step 420, the plurality of temperature sensors are able to perform temperature measurements at various regions on the face plate. Each sensor is configured, for a specified response time $t_c$, to sense a local temperature, generate temperature data, sent the temperature data to the controller, then repeat the process. As the controller receives data from the sensors, the control circuitry can compute the difference between the current measured temperature value and a predetermined temperature value depending on particular thermal process and baking chamber setup conditions (step 430). In one embodiment, step 430 periodically repeats with a time period of $t_c$. In other embodiments, the period may be modified as a function of the determined temperature difference or other variables. Additionally, step 430 may include multiple computations performed in parallel. Such parallel processing may be performed either in a mutually independent manner or in an inter-related manner depending on particular process requirements.

As a result, one or more temperature control signals may be processed or modified by the controller at step 440. In a particular embodiment, at step 440, a pre-loaded wafer temperature sensitivity to the face plate temperature has been established either through simulation or empirical data collected during processing experiments for a given bake chamber configuration. For example, plots like that shown in FIG. 2 or FIG. 3 can be obtained and programmed into the control circuitry for proper modification of the one or more temperature control signals that are provided to the bake plate. Of course, one would recognize many variations, alternatives, and modifications when defining a specific control scheme based on a specific baking process.

In one embodiment, the temperature sensitivity to the face plate temperature is a negative response indicator of the temperature compensation provided to the bake plate temperature in order to maintain a steady state wafer temperature. At step 450, the bake plate temperature will be adjusted by the modified control signal. For example, the modified control signal is derived from a negative response indicator associated with the temperature sensitivity to the face plate temperature. As an example, assuming the face plate temperature is sensed lower than a preset temperature value by a temperature sensor, the control signal would be modified in a negative way by the control circuitry. Particularly, the modified corresponding control signal should lead to an appropriate increase of bake plate temperature to provide the desired temperature compensation. On the other hand, if the face plate temperature is detected to be higher than a predetermined temperature value, the modified control signal based on the negative response indicator will provide bake plate control signals that will result in a decrease in bake plate temperature, thereby properly achieving the desired steady state temperature control for the wafer.

It should be appreciated that the specific steps illustrated in FIG. 4 provide a particular method of controlling wafer temperature during thermal processing in a semiconductor chamber according to an embodiment of the present invention. Other sequences of steps may also be performed according to alternative embodiments. For example, same sequence of steps may be repeated loops that are cycled in a period of time $t_c$, where $t_c$ is associated with a temperature sensor's sensing response time. Embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5:
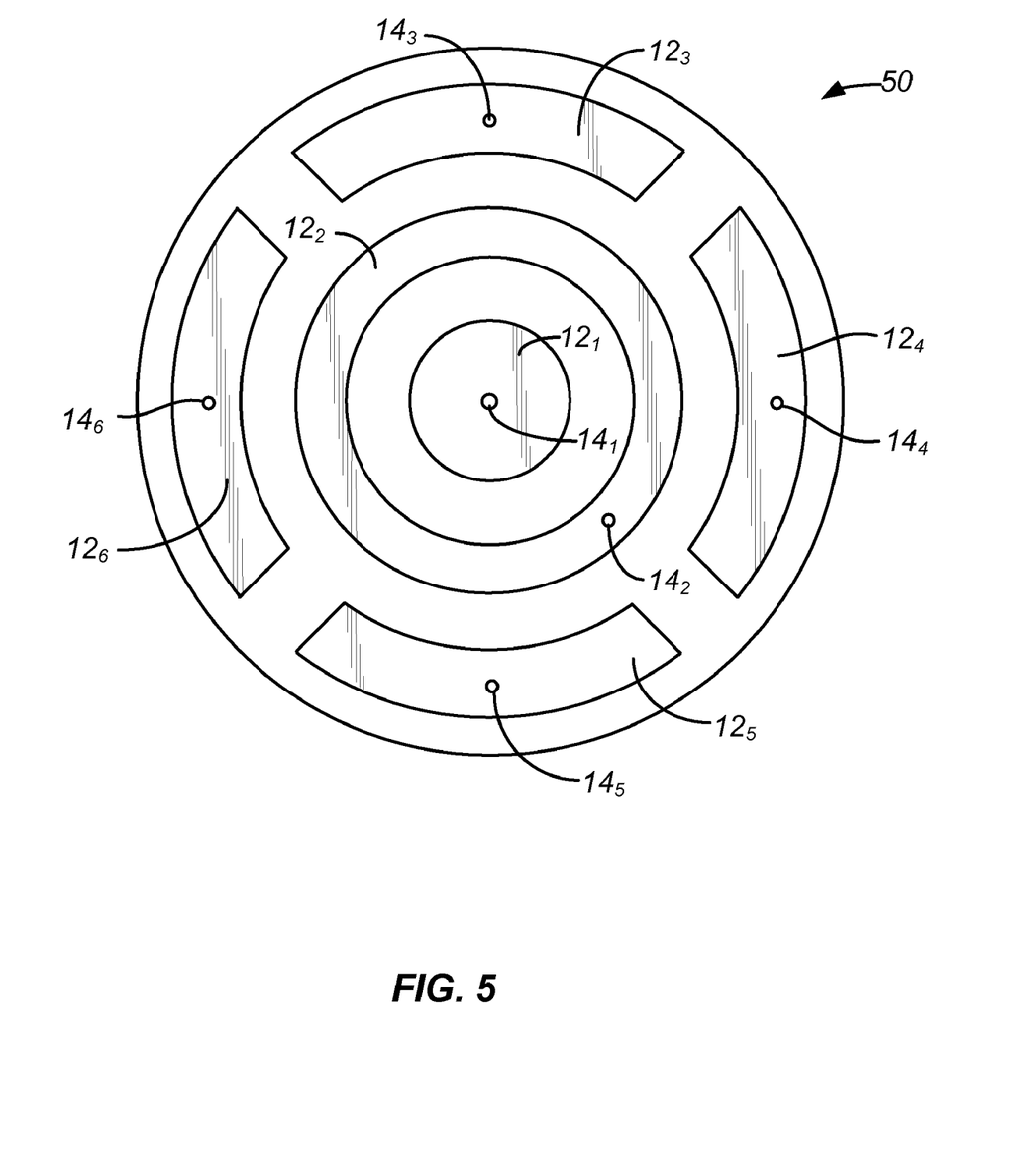
FIG. 5 is a plan view of a multi-zone bake plate having six different electrically independently heating zones according to an embodiment of the present invention.

In an alternative embodiment, the bake plate may include multiple zones in which separate heating elements are embedded and independently coupled to the controller for receiving corresponding temperature control signals. Thus, the temperature at each zone can be independently controlled. FIG. 5 is a plan view of a multi-zone bake plate having six different electrically independently heating zones according to an embodiment of the present invention. For example, in a specific embodiment, the bake plate 50 includes two or more insulating layers with a kapton layer sandwiched between the insulating layers. In one example, the bake plate 10 is the bake plate 120 utilized in the bake chamber 100 illustrated in FIG. 1. As shown in FIG. 5, bake plate 50 includes six independent heater zones $12_1$-$12_6$ along with a corresponding number of second temperature sensors $14_1$-$14_6$, one for each of the heater zones $12_1$-$12_6$. When in the bake position, each of the heater zones $12_1$-$12_6$ respectively is opposing one region on the face plate where a corresponding first temperature sensor may be disposed to detect the temperature at the corresponding region of the face plate.

Depending on the particular application, various types of second temperature sensors including resistance temperature detectors (RTDs) may be utilized for the various heater zones for monitoring the local zone temperature. For example, a controller can receive sensor data, one for each region on the face plate from a corresponding first temperature sensor corresponding to multiple regions of the face plate respectively opposing the heater zones $12_1$-$12_6$. For each corresponding pair of face plate region to bake plate zone, there is a separate temperature sensitivity relationship which may be similar to the plot shown in FIG. 2 or FIG. 3. After independently processing the sensor data corresponding to each pair of regions, the controller can provide a modified temperature control signal to a corresponding heating element of one heater zone among the heater zones $12_1$-$12_6$. Metal traces formed into a patterned wiring layer for each heating element are then used to resistively heat the various heater zones $12_1$-$12_6$. Then the bake plate 50 has multiple zone temperatures independently controlled in particular heater zones that separately compensate the temperature drift at corresponding regions of the face plate. The mapping from face plate regions to bake plate zones may be a function depending on additional face plate regions not opposing the bake plate zone. One of ordinary skill in the art would recognize many variations, modifications, and alternatives. Additional description of multi-zone heater plates is provided in U.S. patent application Ser. No. 11/483,832, filed on Jul. 7, 2006, commonly assigned and hereby incorporated by reference for all purposes.

Figure 6:
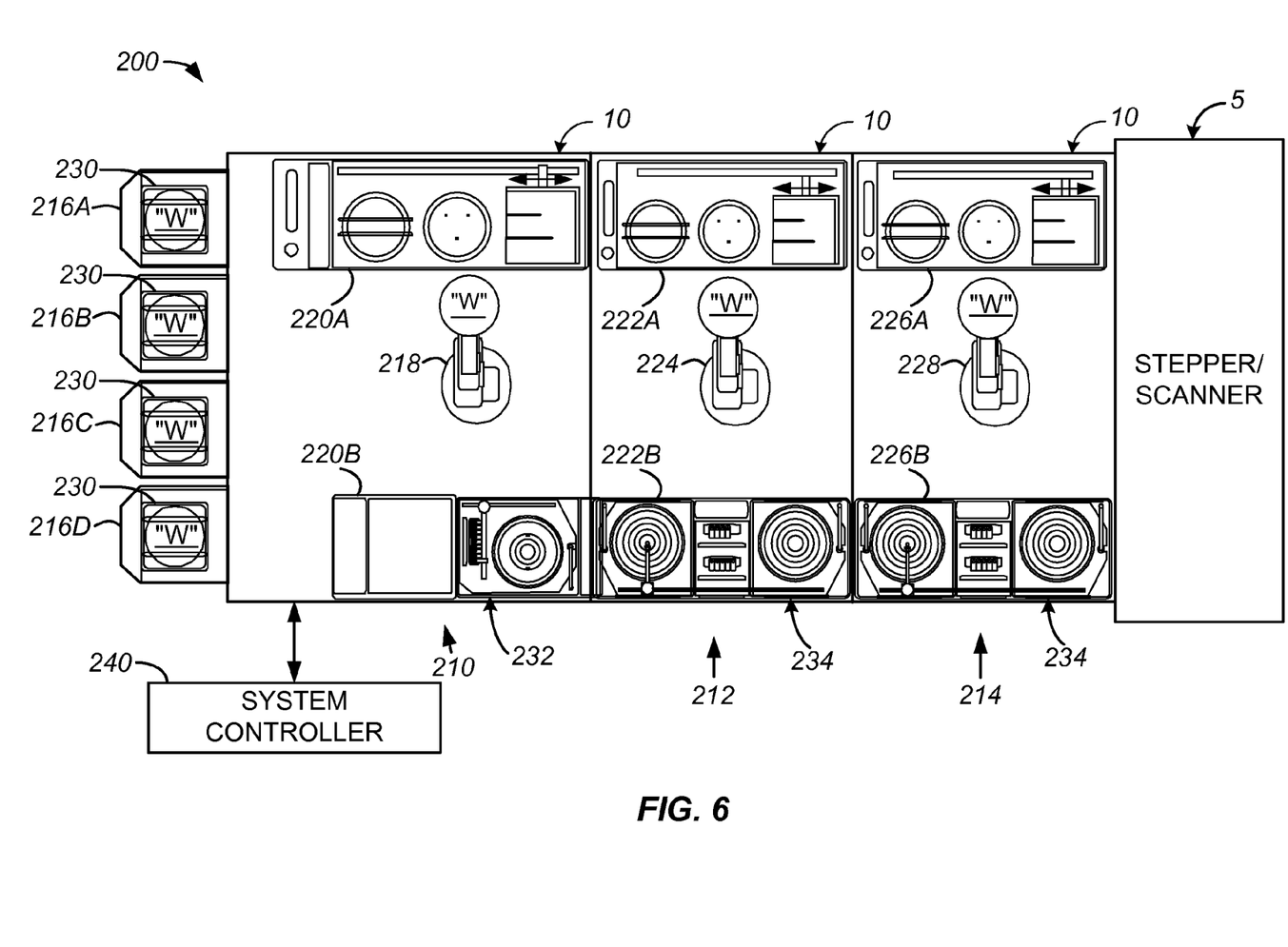
FIG. 6 is a simplified architecture of a track lithography tool according to an embodiment of the present invention.

The wafer temperature control method and related bake chamber system can be applied to many thermal processes involved in the operation of a track lithography tool. FIG. 6 is a simplified architecture of a track lithography tool according to an embodiment of the present invention. As illustrated in FIG. 6, track lithography 200 contains a front end module 210 (sometimes referred to as a factory interface) 210, a central module 212, and a rear module 214 (sometimes referred to as a scanner interface). Front end module 210 generally contains one or more pod assemblies or FOUPS (e.g., items 216A-D), a front end robot 218, and front end processing racks 220A, 220B. The one or more pod assemblies 216A-D are generally adapted to accept one or more cassettes 230 that may contain one or more substrates "W", or wafers, that are to be processed in track lithography tool 200.

Central module 212 generally contains a first central processing rack 222A, a second central processing rack 222B, and a central robot 224. Rear module 214 generally contains first and second rear processing racks 226A, 226B and a back end robot 228. Front end robot 218 is adapted to access processing modules in front end processing racks 220A, 220B; central robot 224 is adapted to access processing modules in front end processing racks 220A, 220B, first central processing rack 222A, second central processing rack 222B and/or rear processing racks 226A, 226B; and back end robot 228 is adapted to access processing modules in the rear processing racks 226A, 226B and in some cases exchange substrates with a stepper/scanner 5.

The stepper/scanner 5, which may be purchased from Canon USA, Inc. of San Jose, Calif., Nikon Precision Inc. of Belmont, Calif., or ASML US, Inc. of Tempe Ariz., is a lithographic projection apparatus used, for example, in the manufacture of integrated circuits (ICs). The scanner/stepper tool 5 exposes a photosensitive material (resist), deposited on the substrate in the cluster tool, to some form of electromagnetic radiation to generate a circuit pattern corresponding to an individual layer of the integrated circuit (IC) device to be formed on the substrate surface.

Each of the processing racks 220A, 220B; 222A, 222B and 226A, 226B contain multiple processing modules in a vertically stacked arrangement. That is, each of the processing racks may contain multiple stacked integrated thermal units 10, multiple stacked coater modules 232, multiple stacked coater/developer modules with shared dispense 234 or other modules that are adapted to perform the various processing steps required of a track photolithography tool. As examples, coater modules 232 may deposit a bottom antireflective coating (BARC); coater/developer modules 234 may be used to deposit and/or develop photoresist layers and integrated thermal units 10 may perform bake and chill operations associated with hardening BARC and/or photoresist layers.

In one embodiment, a system controller 240 is used to control all of the components and processes performed in the cluster tool 200. The controller 240 is generally adapted to communicate with the stepper/scanner 5, monitor and control aspects of the processes performed in the cluster tool 200, and is adapted to control all aspects of the complete substrate processing sequence. In some instances, controller 240 works in conjunction with other controllers, such as controllers 46A-46D, which control hot plate 20 and chill plate 30 of integrated thermal unit 10, to control certain aspects of the processing sequence. The controller 240, which is typically a microprocessor-based controller, is configured to receive inputs from a user and/or various sensors in one of the processing chambers and appropriately control the processing chamber components in accordance with the various inputs and software instructions retained in the controller's memory. The controller 240 generally contains memory and a CPU (not shown) which are utilized by the controller to retain various programs, process the programs, and execute the programs when necessary. The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include cache, power supplies, clock circuits, input/output circuitry, subsystems, and the like all well known in the art. A program (or computer instructions) readable by the controller 240 determines which tasks are performable in the processing chamber(s). Preferably, the program is software readable by the controller 240 and includes instructions to monitor and control the process based on defined rules and input data.

It is to be understood that embodiments of the invention are not limited to use with a track lithography tool such as that depicted in FIG. 6. Instead, embodiments of the invention may be used in any track lithography tool including the many different tool configurations described in U.S. application Ser. No. 11/112,281 entitled "Cluster Tool Architecture for Processing a Substrate" filed on Apr. 22, 2005, which is hereby incorporated by reference for all purposes and including configurations not described in the Ser. No. 11/112,281 application.

While the present invention has been described with respect to particular embodiments and specific examples thereof, it should be understood that other embodiments may fall within the spirit and scope of the invention. The scope of the invention should, therefore, be determined with reference to the appended claims along with their full scope of equivalents.

What is claimed is:

1. A method of controlling temperature of a wafer in a semiconductor process chamber, the method comprising:
    loading a wafer on a bake plate, the wafer opposing a face plate, the bake plate including a plurality of heater zones;
    providing a plurality of temperature control signals to the bake plate, each of the plurality of temperature control signals being directed to one of the plurality of heater zones;
    performing temperature measurements at a plurality of regions on the face plate, each of the plurality of regions corresponding to and opposing one of the plurality of heater zones;
    determining differences between a face plate temperature at each of the plurality of regions and a predetermined temperature; and
    modifying each of the plurality of temperature control signals provided to the bake plate in response to the determined differences.

2. The method of claim 1 wherein each of the plurality of heater zones includes an independently controllable heating element configured to maintain a zone temperature based on a corresponding one of the plurality of temperature control signals.

3. The method of claim 2 wherein modifying each of the plurality of temperature control signals in response to the determined difference comprises determining a temperature sensitivity to a face plate temperature at one of the plurality of regions on the face plate as a function of the zone temperature.

4. The method of claim 3 further comprising adjusting the heating element of one of the plurality of heater zones to change the zone temperature from a first temperature to a second temperature based on the modified temperature control signal corresponding to the one of the plurality of heater zones.

5. The method of claim 1 wherein performing temperature measurements at a plurality of regions on the face plate comprises sensing an electrical signal from at least one of a thermocouple or a RTD disposed at each of the plurality of regions.

* * * * *